US007148684B2

(12) United States Patent
Laubacher et al.

(10) Patent No.: US 7,148,684 B2
(45) Date of Patent: Dec. 12, 2006

(54) METHOD FOR BIOLOGICAL IDENTIFICATION USING HIGH TEMPERATURE SUPERCONDUCTOR ENHANCED NUCLEAR QUADRUPOLE RESONANCE

(75) Inventors: Daniel B. Laubacher, Wilmington, DE (US); James D. McCambridge, Swarthmore, PA (US)

(73) Assignee: E.I. Du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/971,378

(22) Filed: Oct. 22, 2004

(65) Prior Publication Data
US 2006/0017439 A1    Jan. 26, 2006

Related U.S. Application Data

(60) Provisional application No. 60/513,834, filed on Oct. 23, 2003.

(51) Int. Cl.
G01V 3/00    (2006.01)
(52) U.S. Cl. .................................. 324/300; 324/317
(58) Field of Classification Search ................ 324/300, 324/317, 321
See application file for complete search history.

(56) References Cited

U.S. PATENT DOCUMENTS

| | | | |
|---|---|---|---|
| 4,514,691 A | 4/1985 | De Los Santos et al. |
| 5,036,279 A | 7/1991 | Jonsen |
| 5,206,592 A | 4/1993 | Buess et al. |
| 5,233,300 A | 8/1993 | Buess et al. |
| 5,262,394 A | 11/1993 | Wu et al. |
| 5,276,398 A | 1/1994 | Withers et al. |
| 5,351,007 A | 9/1994 | Withers et al. |
| 5,457,385 A | 10/1995 | Sydney et al. |
| 5,571,146 A | 11/1996 | Jones et al. |
| 5,583,437 A | 12/1996 | Smith et al. |
| 5,585,723 A | 12/1996 | Withers |
| 5,592,083 A | 1/1997 | Magnuson et al. |
| 5,594,338 A | 1/1997 | Magnuson |
| 5,656,937 A | 8/1997 | Cantor |
| 5,661,400 A | 8/1997 | Plies et al. |
| 5,750,473 A | 5/1998 | Shen |
| 5,804,967 A | 9/1998 | Miller et al. |
| 5,814,987 A | 9/1998 | Smith et al. |
| 5,814,989 A | 9/1998 | Smith et al. |
| 5,973,495 A | 10/1999 | Mansfield |
| 5,986,455 A | 11/1999 | Magnuson |
| 5,999,000 A | 12/1999 | Srinivasan |
| 6,025,719 A | 2/2000 | Anderson |
| 6,054,856 A | 4/2000 | Garroway et al. |
| 6,091,240 A | 7/2000 | Smith et al. |
| 6,104,190 A | 8/2000 | Buess et al. |
| 6,108,569 A | 8/2000 | Shen |
| 6,150,816 A | 11/2000 | Srinivasan |
| 6,166,541 A | 12/2000 | Smith et al. |
| 6,169,399 B1 | 1/2001 | Zhang et al. |
| 6,194,898 B1 | 2/2001 | Magnuson et al. |
| 6,201,392 B1 | 3/2001 | Anderson et al. |
| 6,218,943 B1 | 4/2001 | Ellenbogen |
| 6,242,918 B1 | 6/2001 | Miller et al. |
| 6,291,994 B1 | 9/2001 | Kim et al. |
| 6,335,622 B1 | 1/2002 | James et al. |
| 6,370,404 B1 | 4/2002 | Shen |
| D459,245 S | 6/2002 | Power |
| 6,420,872 B1 | 7/2002 | Garroway et al. |
| 6,486,838 B1 | 11/2002 | Smith et al. |
| 6,538,445 B1 | 3/2003 | James et al. |
| 6,556,013 B1 | 4/2003 | Withers |
| 6,566,873 B1 | 5/2003 | Smith et al. |
| 6,590,394 B1 | 7/2003 | Wong et al. |
| 6,617,591 B1 * | 9/2003 | Simonson et al. ........ 250/459.1 |
| 6,751,489 B1 | 6/2004 | Shen |
| 6,777,937 B1 | 8/2004 | Miller et al. |
| 6,819,109 B1 | 11/2004 | Sowers et al. |
| 6,952,163 B1 * | 10/2005 | Huey et al. .................. 340/521 |
| 2002/0068682 A1 | 6/2002 | Shen |
| 2002/0153891 A1 | 10/2002 | Smith et al. |
| 2002/0169374 A1 | 11/2002 | Jevtic |
| 2002/0190715 A1 | 12/2002 | Marek |
| 2003/0062896 A1 | 4/2003 | Wong et al. |
| 2003/0071619 A1 | 4/2003 | Sauer et al. |
| 2003/0136920 A1 * | 7/2003 | Flores et al. ........... 250/455.11 |
| 2004/0222790 A1 | 11/2004 | Karmi et al. |

FOREIGN PATENT DOCUMENTS

| | | |
|---|---|---|
| EP | 0 426 851 | 5/1991 |
| EP | 1 168 483 | 1/2002 |
| GB | 2 286 248 | 8/1995 |
| GB | 2289 344 | 11/1995 |
| WO | WO 92/19978 | 11/1992 |
| WO | WO 92/21989 | 12/1992 |
| WO | WO 94/05022 | 3/1994 |
| WO | WO 95/34096 | 12/1995 |
| WO | WO 96/39636 | 12/1996 |
| WO | WO 98/37438 | 8/1998 |
| WO | WO 98/54590 | 12/1998 |

(Continued)

OTHER PUBLICATIONS

Colton et al. "Making the World a Safer Place" Feb. 28, 2003, Science, vol. 299, Issue 5611, 1324-1325.*

(Continued)

Primary Examiner—Louis Arana

(57) ABSTRACT

This invention relates to a method for identifying biological agents using high temperature superconductor enhanced nuclear quadrupole resonance. The targeted biological agents are attached to functionalized nanoparticles and the quadrupole nuclei in these nanoparticles are detected by the nuclear quadrupole resonance detection system.

6 Claims, No Drawings

FOREIGN PATENT DOCUMENTS

| WO | WO 99/45409 | 9/1999 |
|---|---|---|
| WO | WO 99/50689 | 10/1999 |
| WO | WO 00/70356 | 11/2000 |
| WO | WO 02/098364 | 12/2002 |
| WO | WO 03/014700 | 2/2003 |
| WO | WO 03/040761 | 5/2003 |
| WO | WO 03/096041 | 11/2003 |

OTHER PUBLICATIONS

Miller, et al., "Performance of a High-Temperature Superconducting Probe for In Vivo Microscopy at 2.0 T", Magnetic Resonance in Medicine, (1999) pp. 72-79, vol. 41.

W.H. Wong, et al., "HTS Coils for High Resolution Nuclear Magnetic Resonance Spectroscopy", Advances in Cryogenic Engineering, (1996), pp. 953-959, New York.

V. Kotsubo et al., "Cryogenic System for a High Temperature Superconductor NMR Probe", Advances in Cryogenic Engineering, Jul. 17, 1995, vol. 41, pp. 1857-1864, New York.

Kushida, et al., "Dependence on the Pure Quadrupole Resonance Frequency on Pressure and Temperature", Physical Review, (Dec. 1956), pp. 1364-1377, vol. 104, No. 5, Massachusetts.

Vanier, "Temperature Dependence of the Pure Nuclear Quadrupole Resonance Frequency in KC103", Canadian Journal of Physics, (Nov. 1960), pp. 1397-1405, vol. 38, No. 11, Canada.

Smith, et al., "Nitrogen Electric Quadrupole and Proton Magnetic Resonances in Thiourea", Journal of Chemical Physics, (Oct. 1964), pp. 2403-2416, vol. 41, No. 8, New York.

Turner, C.W., High temperature superconductor circuit components for cryogenic microwave systems, Electrical and Computer Engineering, 1993, Canadian Conference on Vancouver, BC Canada (Sep. 14-17, 1993) XP 010118071.

W. A. Edelstein et al., A signal-to-noise calibration procedure for NMR imaging systems, Medical Physics, vol. 11 (2) Mar./Apr. 1984, pp. 180-185.

He, D.F. et al., "Metal detector based in high-Tc RF SQUID", Physica C 378-381 (2002) pp. 1404-1407.

Wilker, "HTS Sensors for NQR Spectroscopy", Microwave Symposium Digest, vol. 1, pp. 143-146 (2004).

Stensgaard, "Optimized Design of the Shielded-Loop Resonator", Journal of Magnetic Resonance, Series A 122, 120-125 (1996).

\* cited by examiner

METHOD FOR BIOLOGICAL IDENTIFICATION USING HIGH TEMPERATURE SUPERCONDUCTOR ENHANCED NUCLEAR QUADRUPOLE RESONANCE

This application claims benefit of provisional application No. 60/513,834 filed Oct. 23, 2003.

FIELD OF THE INVENTION

This invention relates to the use of high temperature superconductor enhanced nuclear quadrupole resonance to detect biological agents.

BACKGROUND OF THE INVENTION

With the increased concern regarding bioterrorism and the need to promote homeland security, it is critical to have a method for the rapid detection and identification of biological agents that could be used for terrorism.

The use of nuclear quadrupole resonance (NQR) as a means of detecting explosives and other contraband has been recognized for some time, see e.g. T. Hirshfield et al, *J. Molec. Struct.* 58, 63 (1980), A. N. Garroway et al, *Proc. SPIE* 2092, 318 (1993), and A. N. Garroway et al, *IEEE Trans. on Geoscience and Remote Sensing* 39, 1108 (2001). NQR provides some distinct advantages over other detection methods. NQR spectroscopy can detect and discriminate specific solid state materials containing quadrupole nuclei, i.e. nuclei with a quadrupole moment. As with nuclear magnetic resonance (NMR), a radio frequency coil produces an oscillating magnetic field at a frequency identified with a specific compound containing one or more quadrupole nuclei. If the specific compound is present a return NQR signal is detected. Unlike NMR, NQR requires no static magnetic field. NQR spectroscopy is extremely cost effective since it is a radio frequency (RF) technique in a frequency region where silicon based electronics operate. NQR detection systems use non-ionizing magnetic fields near 5 MHz, and therefore present no health hazards to nearby workers and will not damage materials sensitive to ionizing radiation. The average power of the applied oscillating magnetic field in a NQR detection system is about 100 Watts, and it can thus operate from standard alternating current (AC) electrical outlets (either 110 V or 240V).

A number of fundamental problems exist for the conventional approach to NQR spectroscopy. These problems result in low throughput and long measurement times. The use of high temperature superconductor (HTS) self-resonant structures, particularly HTS self-resonant receive coils, i.e. sensors, dramatically improves the sensitivity of the NQR spectrometer. For example, the high quality factor Q of an HTS sensor results in a 5–20 dB improvement in the signal-to-noise ratio (S/N) as compared to a conventional sensor. This is important in view of the low intensity NQR signal. HTS enhanced NQR systems have been scientifically demonstrated for the detection of macroscopic samples of contraband such as explosives and drugs.

The object of this invention is to use HTS enhanced NQR systems to provide a method for detecting biological agents, particularly those that could be used for bioterrorism.

SUMMARY OF THE INVENTION

In one embodiment, this invention provides a method for detecting one or more targeted biological agents in air by:

(a) collecting a biological agent from the air and concentrating the biological agent in a liquid to form a sample thereof;

(b) placing functionalized nanoparticles in the liquid with the biologicalagent, wherein the functionalized nanoparticles contain nuclei with a quadrupole moment and wherein the functionalized nanoparticles attach to the one or more targeted biological agents to produce assembled nanoparticle-biological agent composites;

(c) filtering and drying the assembled nanoparticle-biological agent composites to form a nanoparticle-biological agent sample;

(d) placing the nanoparticle-biological agent sample in a NQR spectrometer, the NQR spectrometer comprising one or more high temperature superconductor coils that serve both as excitation coils to provide a radio frequency magnetic field to excite the quadrupole nuclei in the nanoparticles of the nanoparticle-biological agent sample and receive coils to detect the nuclear quadrupole resonance signal from the quadrupole nuclei; and (e) using the NQR spectrometer to excite the quadrupole nuclei and detect the quadrupole NQR signal and thereby confirm the presence of the one or more targeted biological agents.

In another embodiment, this invention provides a method for detecting one or more targeted biological agents in air by:

(a) collecting a biological agent from the air and concentrating the biological agent in a liquid to form a sample thereof;

(b) placing functionalized nanoparticles in the liquid with the biological sample, wherein the functionalized nanoparticles contain nuclei with a quadrupole moment and wherein the functionalized nanoparticles attach to the one or more targeted biological agents to produce assembled nanoparticle-biological agent composites;

(c) filtering and drying the assembled nanoparticle-biological agent composites to form a nanoparticle-biological agent sample;

(d) placing the nanoparticle-biological agent sample in a NQR spectrometer, the NQR spectrometer comprising:

(i) one or more coils used solely as excitation coils to provide a radio frequency magnetic field to excite the quadrupole nuclei in the nanoparticles of the nanoparticle-biological agent sample, and (ii) one or more coils used solely as receive coils to detect the nuclear quadrupole resonance signal from the quadrupole nuclei; and (e) using the NQR spectrometer to excite the quadrupole nuclei and detect the quadrupole NQR signal and thereby confirm the presence of the one or more targeted biological agents.

In still another embodiment, this invention provides a method for detecting one or more targeted biological agents in air by:

(a) collecting a biological agent to form a sample thereof;

(b) forming assembled nanoparticle-biological agent composites using functionalized nanoparticles and said biological agent contained in the sample, wherein the nanoparticles contain quadrupole nuclei;

(c) placing the nanoparticle-biological agent composites in a NQR spectrometer; and (d) using the NQR spectrometer to excite the quadrupole nuclei and detect the quadrupole NQR signal and thereby confirm the presence of the one or more targeted biological agents.

In yet another embodiment, this invention involves a method for detecting one or more targeted biological agents using a NQR spectrometer by:
(a) preparing nanoparticle-biological agent composites, wherein the nanoparticles contain quadrupole nuclei;
(b) placing the nanoparticle-biological agent composites in the NQR spectrometer; and
(c) using the NQR spectrometer to excite the quadrupole nuclei and detect the quadrupole NQR signal and thereby confirm the presence of the one or more targeted biological agents.

DESCRIPTION OF THE PREFERRED EMBODIMENTS

The method of this invention addresses the biggest challenge for a biological agent detection system, the ability to pick out a specific signal from the targeted biological agent while minimizing any signals originating from nonpathogenic biological background. The technology that makes this possible is high temperature superconductivity enhanced nuclear quadrupole resonance. This technology has not previously been utilized for detecting biological agents.

A critical key to the performance of a system based upon HTS enhanced NQR is the ability to miniaturize various critical RF components, such as the HTS self-resonant receive coils, sufficiently to detect small amounts of a biological agent collected during a short collection and analysis time such as a 2 minute collection and analysis time. The biological agents of interest are typically microorganisms that can cause physical harm to or disease among personnel, animals or plants. They can also cause the deterioration of material. These agents generally fall into two broad categories—pathogens (usually called germs) and toxins. Pathogens are living microorganisms that cause lethal or incapacitating diseases. Bacteria, rickettsiae, fungi and viruses are included in the pathogens. Toxins are poisons that plants, animals or microorganisms produce naturally. Possible biological war-fare toxins include a variety of neurotoxic (affecting the central nervous system) and cytotoxic (causing cell death) compounds.

When the biological agent is airborne, a sample of a biological agent can be obtained in a variety of ways such as by using one of the existing commercial aerosol collection and concentration technologies, e.g. BioCaptive™, MesoSystems, Kennewick, Wash. 99336. These systems typically pass large volumes of air through the collection system and disperse the biological agent in a small volume of liquid such as water to form the sample. When a sample is prepared in a cyclone collector the larger particles, i.e. the particles of a biological agent, are collected on the outer wall as a result of centrifugal force and then fall into a container. The smaller particles remain in the air stream leaving through the air outlet. These current systems are approximately 50% efficient in capture and concentration of most bioterrorism agents with airflow rates up to 1000 liters per minute.

If the commercial equipment does not form a sample by dispersing the biological agent in a liquid, this step may be carried out by simply placing the biological agent in a small amount of liquid such as water or any liquid that does not destroy the biological agent or interfere with the attachment of the biological agent to a functional nanoparticle. Typically, about 10 mL or less of liquid can be used.

Functionalized nanoparticles, which have at least one dimension on the order of nanometers, are then added to the liquid sample containing the biological agent. Functionalized nanoparticles are prepared so that they attach themselves to the targeted biological agent, e.g. a virus, toxin, or bacterial spore. This attachment is based, for example, on nucleic acid, antibody/antigen binding or ligand/receptor interactions, and provides assembled nanoparticle-biological agent composites. The nanoparticles are "functionalized" by treating their surfaces with a biological or chemical entity known to bind to the targeted biological agent. Typically, gold nanoparticles are used to make functionalized nanoparticles. Nanoparticles can, however, be made from materials containing other metals such as aluminum, cobalt, copper or antimony. Functionalized nanoparticles and the biological sample can also be mixed in the dry state or in a gel. Mixing in a liquid is preferred, however, to provide a more rapid and complete attachment of the functionalized nanoparticles to the biological agent.

The functionalized nanoparticles can be of only one type that attaches to only one targeted biological agent, or can be a variety of types that attach to a variety of targeted biological agents. The use of functionalized nanoparticles is a critical key to reducing the effect of nonpathogenic biological background in the environment.

The assembled nanoparticle-biological agent composites are filtered and, if they were prepared in liquid, dried to form a nanoparticle-biological agent sample. Any separation process can be used that separates the assembled nanoparticle-biological agent composites from the nanoparticles that do not form a composite with the biological agent. A separation system based on size is suitable because the assembled nanoparticle-biological agent composites are typically larger than the nanoparticles that do not form a composite with the biological agent. The nanoparticles that do not form a composite with the biological agent can be re-used or disposed of after they have been separated from the sample.

The sample of the nanoparticle-biological agent, containing the assembled nanoparticle-biological agent composites, is then placed in a NQR spectrometer. In view of the small quantity of biological material collected, the presence of nanoparticle-biological agent composites in the nanoparticle-biological agent is not visibly discernable.

The NQR spectrometer is comprised of at least one excitation coil and at least one high temperature superconductor receive coil. A NQR spectrometer can have one or more coils that serve as both excitation and receive coils or it can have separate coils that only excite and only receive. An excitation coil, i.e. transmit coil, of an NQR detection system provides a radio frequency (RF) magnetic field that excites the quadrupole nuclei in a sample, and results in their producing their characteristic resonance signals that the receive coil detects.

In this invention, the quadrupole nuclei are in the nanoparticles of the nanoparticle-biological agent sample. The quadrupole nuclei can be chosen from any of the nuclei with spin greater than or equal to 1, i.e. from nuclei that have a quadrupole moment. It is preferred to use an element for which the quadrupole nucleus is a predominant isotope of that element.

If only one targeted biological agent is to be detected, only one type of functionalized nanoparticle, i.e. a functionalized nanoparticle that attaches to that targeted biological agent, is needed. In this case, detection of the nuclear quadrupole resonance frequency of the quadrupole nuclei in the nanoparticles of the nanoparticle-biological agent sample confirms the presence of the targeted biological agent. If more than one targeted biological agent are to be detected, a functionalized nanoparticle that attaches to each of the different targeted biological agents is needed. If each functionalized nanoparticle that attaches to at least one of the different targeted biological agents contains the same quadrupole nuclei, detection of an NQR signal will indicate that one or more of the targeted biological agents is present. Preferably, however, each functionalized nanoparticle attaches to a different targeted biological agent, and each nanoparticle contain a different quadrupole nuclei. By attaching a nanoparticle containing a specific type of quadrupole nuclei to each specific targeted biological agent, the detection of an NQR signal from that particular quadrupole nuclei will indicate that the specific targeted biological agent attached to the nanoparticle containing that specific type of quadrupole nuclei is present.

In any case, if no targeted biological agent is present, there will be no nanoparticle-biological agent composites present in the sample, i.e. no quadrupole nuclei to excite, and therefore no NQR signal will be detected. If no targeted biological agent is present, the nanoparticles will be removed from the sample by the separation process just as will those nanoparticles that do not for some reason form a composite with the biological agent when it is present in the sample. The nanoparticles that do form a composite will remain in the sample after the separation process, and it is the detection the quadrupole nuclei in those nanoparticles that will indicate the presence of the biological agent.

When the biological agent is available in a more concentrated form, e.g. on a surface or in an envelope, a biological sample can be obtained by collecting some of the agent with a small scoop. Again the functionalized nanoparticles and the biological sample can be mixed in the dry state, in a gel or in a liquid so that the functionalized nanoparticles can attach to the biological agent to form assembled nanoparticle-biological agent composites. A liquid is preferred. Once the nanoparticle-biological agent composites are formed, they are placed in a NQR spectrometer to detect the one or more biological agents as described previously.

It is especially advantageous to use a receive coil, i.e. a sensor, made of a high temperature superconductor (HTS) rather than copper since the HTS self-resonant coil has a quality factor Q of the order of $10^3$–$10^6$. The NQR signals have low intensity and short duration. In view of the low intensity NQR signal, it is important to have a signal-to-noise ratio (S/N) as large as possible. The signal-to-noise ratio is proportional to the square root of Q so that the use of a HTS self-resonant coil as a receive coil results in an increase in S/N by a factor of 10–100 over that of a copper coil. Therefore, the use of a high temperature superconductor receive coil with a large Q provides a distinct advantage over the use of an ordinary conductor coil. The measurements of the method of this invention are enabled by the high Q and extremely low losses of the HTS receive coils.

When separate coils are used for the excitation and receive coils in the method of this invention, the excitation coils can be made of copper, silver, aluminum or a high temperature superconductor. A copper, silver or aluminum coil is preferably in the form of a shielded-loop resonator (SLR) coil. SLR's have been developed to eliminate the detuning effect of the electrical interaction between the coil and the surrounding material.

When separate coils are used for the excitation and receive coils in the method of this invention, the receive coils are high temperature superconductor coils. When a single coil is used as both an excitation and a receive coil in the method of this invention, the coil is a high temperature superconductor coil. A high temperature superconductor coil is preferably in the form of a self-resonant planar coil, i.e. a surface coil, with a coil configuration of HTS on one or both sides of a substrate. High temperature superconductors are those that superconduct above 77 K. The high temperature superconductors used to form the HTS self-resonant coil are preferably selected from the group consisting of $YBa_2Cu_3O_7$, $Tl_2Ba_2CaCu_2O_8$, $TlBa_2Ca_2Cu_3O_9$, $(TlPb)Sr_2CaCu_2O_7$ and $(TlPb)Sr_2Ca_2Cu_3O_9$. Most preferably, the high temperature superconductor is $YBa_2Cu_3O_7$ or $Tl_2Ba_2CaCu_2O_8$.

What is claimed is:

1. A method for detecting one or more targeted biological agents in air, comprising:
   (a) collecting a biological agent from the air and concentrating the biological agent in a liquid to form a sample thereof;
   (b) placing functionalized nanoparticles in the liquid with the biological agent, wherein the functionalized nanoparticles contain nuclei with a quadrupole moment and wherein the functionalized nanoparticles attach to the one or more targeted biological agents to produce assembled nanoparticle-biological agent composites;
   (c) filtering and drying the assembled nanoparticle-biological agent composites to form a nanoparticle-biological agent sample;
   (d) placing the nanoparticle-biological agent sample in a NQR spectrometer, the NQR spectrometer comprising:
      (i) one or more coils used solely as excitation coils to provide a radio frequency magnetic field to excite the quadrupole nuclei in the nanoparticles of the nanoparticle-biological agent sample, and
      (ii) one or more high temperature superconductor coils used solely as receive coils to detect the nuclear quadrupole resonance signal from the quadrupole nuclei; and
   (e) using the NQR spectrometer to excite the quadrupole nuclei and detect the quadrupole NQR signal and thereby confirm the presence of the one or more targeted biological agents.

2. The method of claim 1, wherein the one or more coils used solely as excitation coils are shielded-loop resonator coils.

3. The method of claim 1, wherein the one or more coils used solely as excitation coils are high temperature superconductor coils.

4. The method of claim 1, wherein two or more targeted biological agents are to be detected, and the functionalized nanoparticles are selected so that the functionalized nanoparticles that attach to each different targeted biological agent contain different quadrupole nuclei, thereby insuring that there is a specific type of quadrupole nuclei attached to each different targeted biological agent.

5. The method of any of claims 1–3, wherein the high temperature superconductor coils are high temperature superconductor self-resonant planar coils.

6. The method of claim 5, wherein two or more targeted biological agents are to be detected, and the functionalized nanoparticles are selected so that the functionalized nanoparticles that attach to each different targeted biological agent contain different quadrupole nuclei, thereby insuring that there is a specific type of quadrupole nuclei attached to each different targeted biological agent.

* * * * *